(12) United States Patent
Jenne

(10) Patent No.: US 7,787,303 B2
(45) Date of Patent: Aug. 31, 2010

(54) PROGRAMMABLE CSONOS LOGIC ELEMENT

(75) Inventor: Fredrick Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 158 days.

(21) Appl. No.: 12/154,547

(22) Filed: May 22, 2008

(65) Prior Publication Data

US 2009/0080260 A1 Mar. 26, 2009

Related U.S. Application Data

(60) Provisional application No. 60/994,708, filed on Sep. 20, 2007.

(51) Int. Cl.
*G11C 16/04* (2006.01)
(52) U.S. Cl. .............................. 365/185.18; 365/185.21; 365/185.25
(58) Field of Classification Search ............ 365/185.18, 365/185, 21, 185.17, 185.25
See application file for complete search history.

(56) References Cited

U.S. PATENT DOCUMENTS

| | | | |
|---|---|---|---|
| 5,424,569 A | 6/1995 | Prall | |
| 6,958,272 B2 | 10/2005 | Lingunis et al. | |
| 7,151,293 B1 * | 12/2006 | Shiraiwa et al. | ............. 257/314 |
| 7,397,701 B2 * | 7/2008 | Yeh et al. | ............... 365/185.18 |
| 7,405,969 B2 * | 7/2008 | Eitan | .................... 365/185.03 |
| 7,554,851 B2 * | 6/2009 | Kuo | ...................... 365/185.24 |
| 2005/0286287 A1 | 12/2005 | Park et al. | |

OTHER PUBLICATIONS

PCT International Search Report and Written Opinion of the International Searching Authority, PCT/US08/06596 filed May 23, 2008, mailed Sep. 4, 2008.

* cited by examiner

*Primary Examiner*—Richard Elms
*Assistant Examiner*—Hien N Nguyen

(57) ABSTRACT

A complementary SONOS-type (CSONOS) logic device is programmed and erased with a common voltage. The programming method involves reading the logic state of a complementary pair without disturbing the logic state after setting the complementary pair of non-volatile trapped-charge memory devices, including a first memory device and a second memory device, to a first logic state or a second logic state with a common voltage to control the complementary pair. The CSONOS device retains data integrity over extended read endurance cycles.

14 Claims, 11 Drawing Sheets

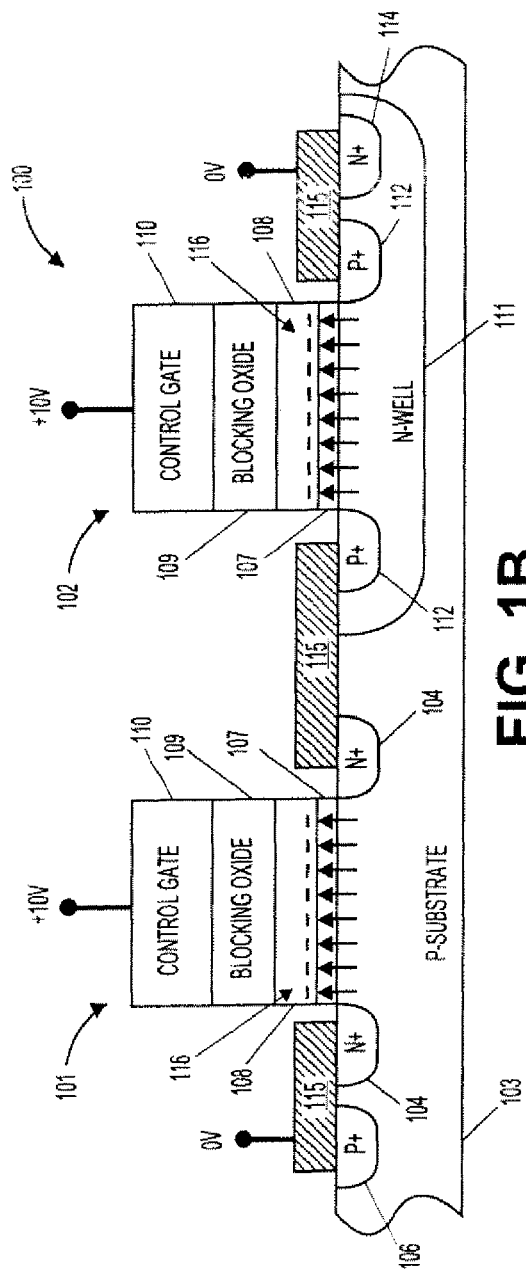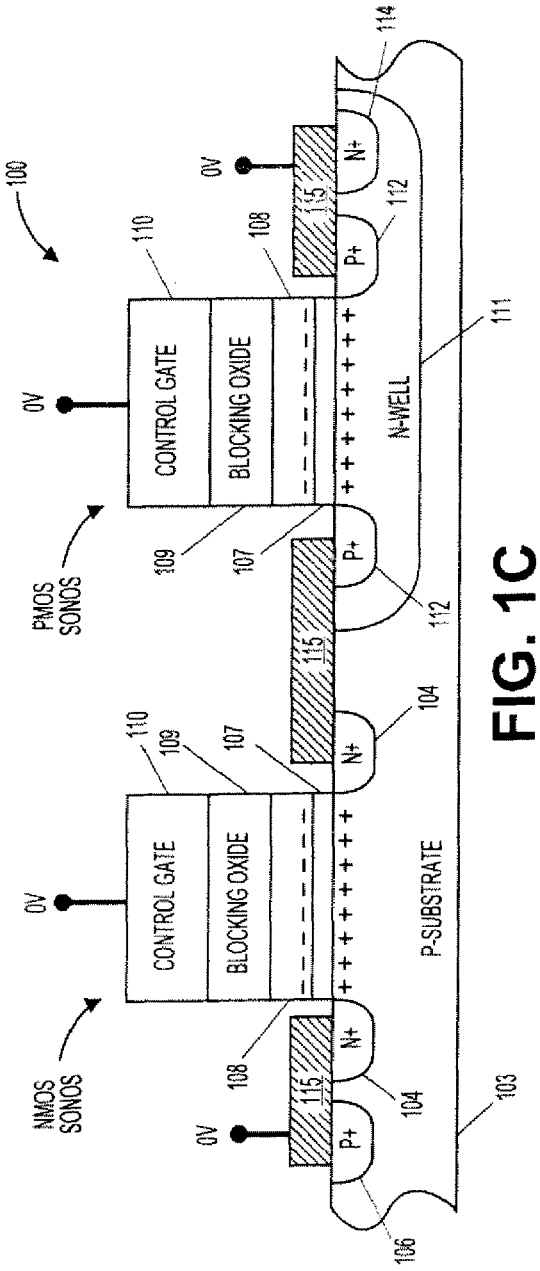

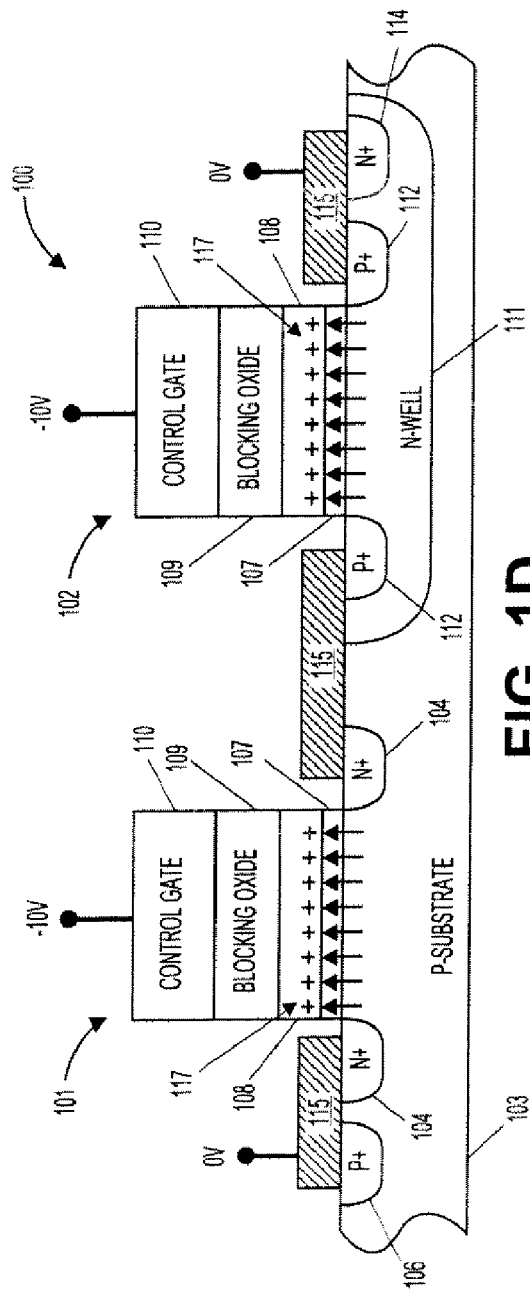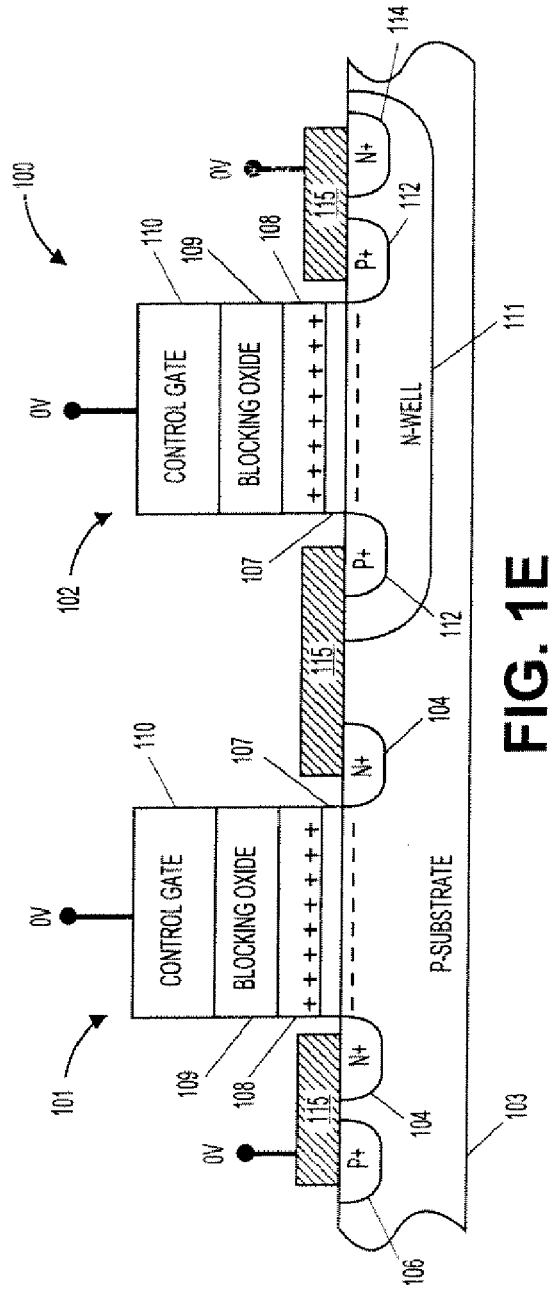
FIG. 1D
FIG. 1E

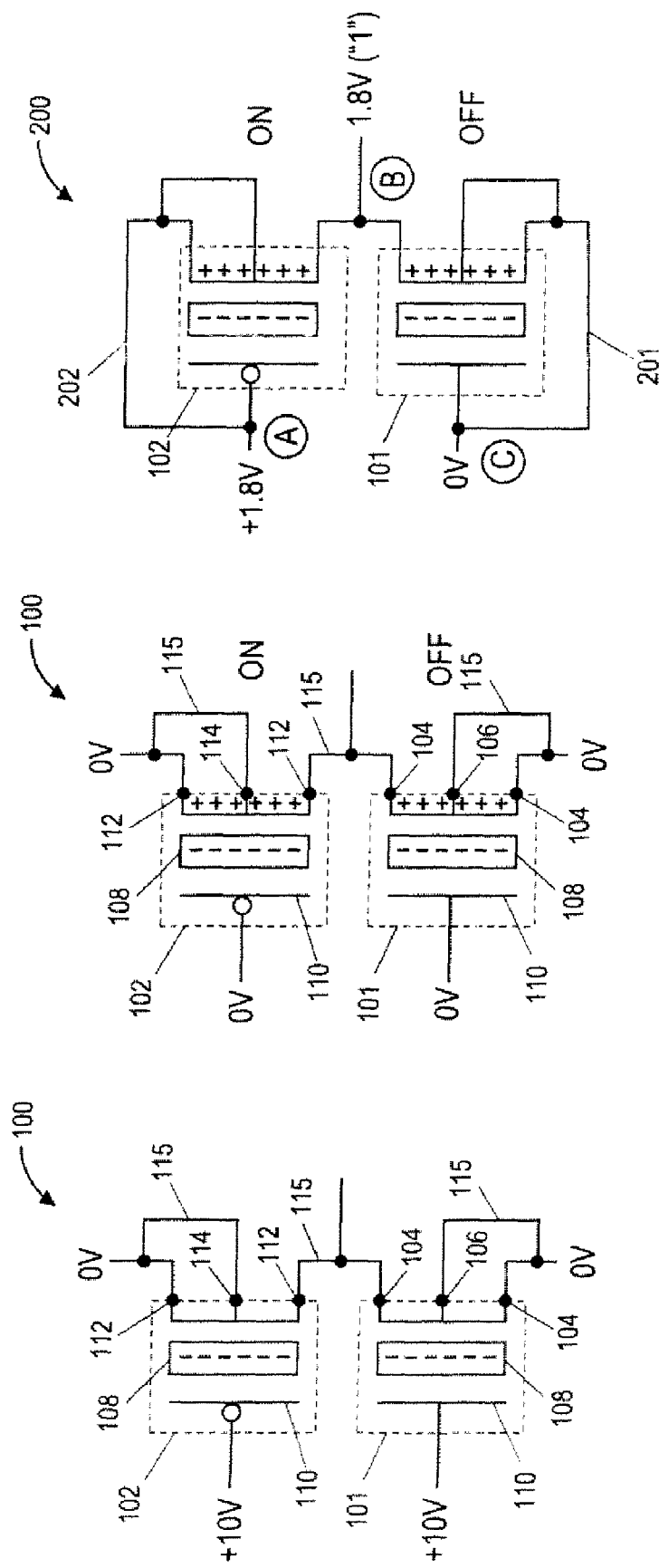

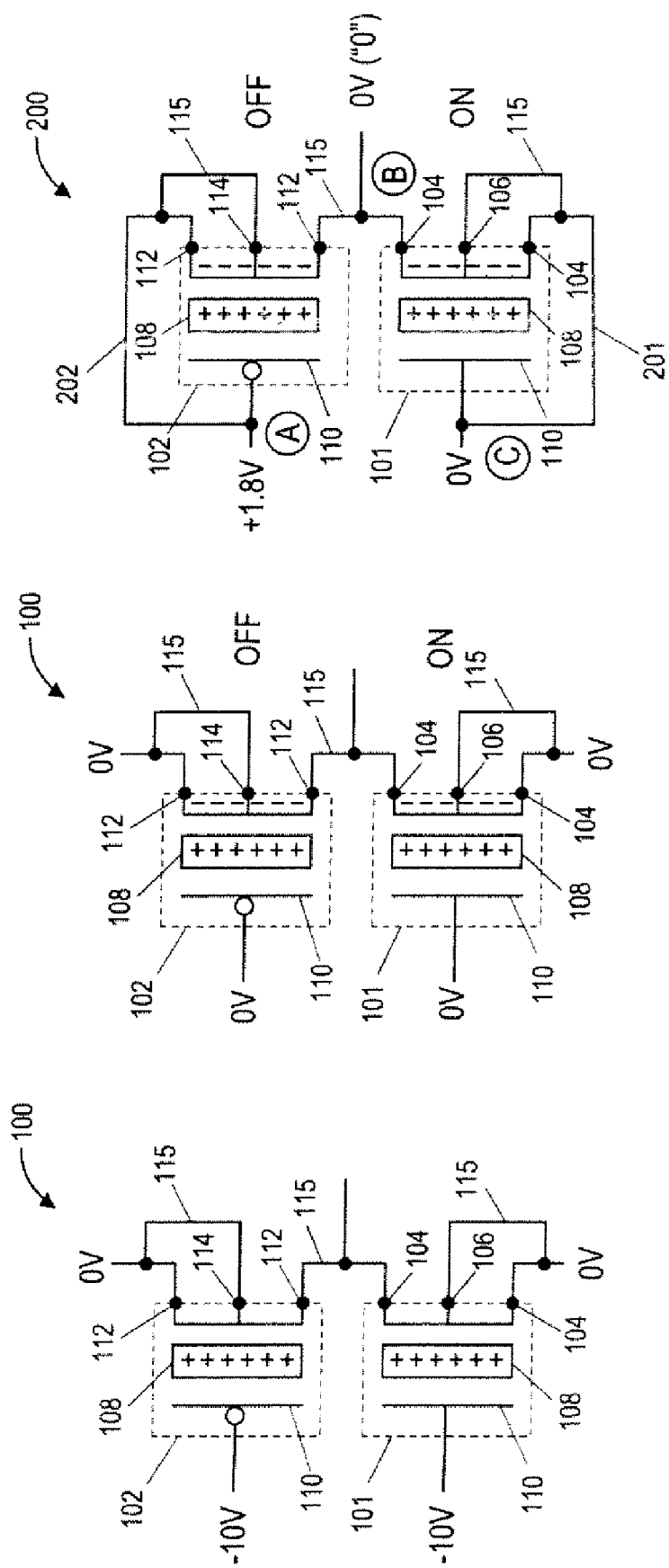

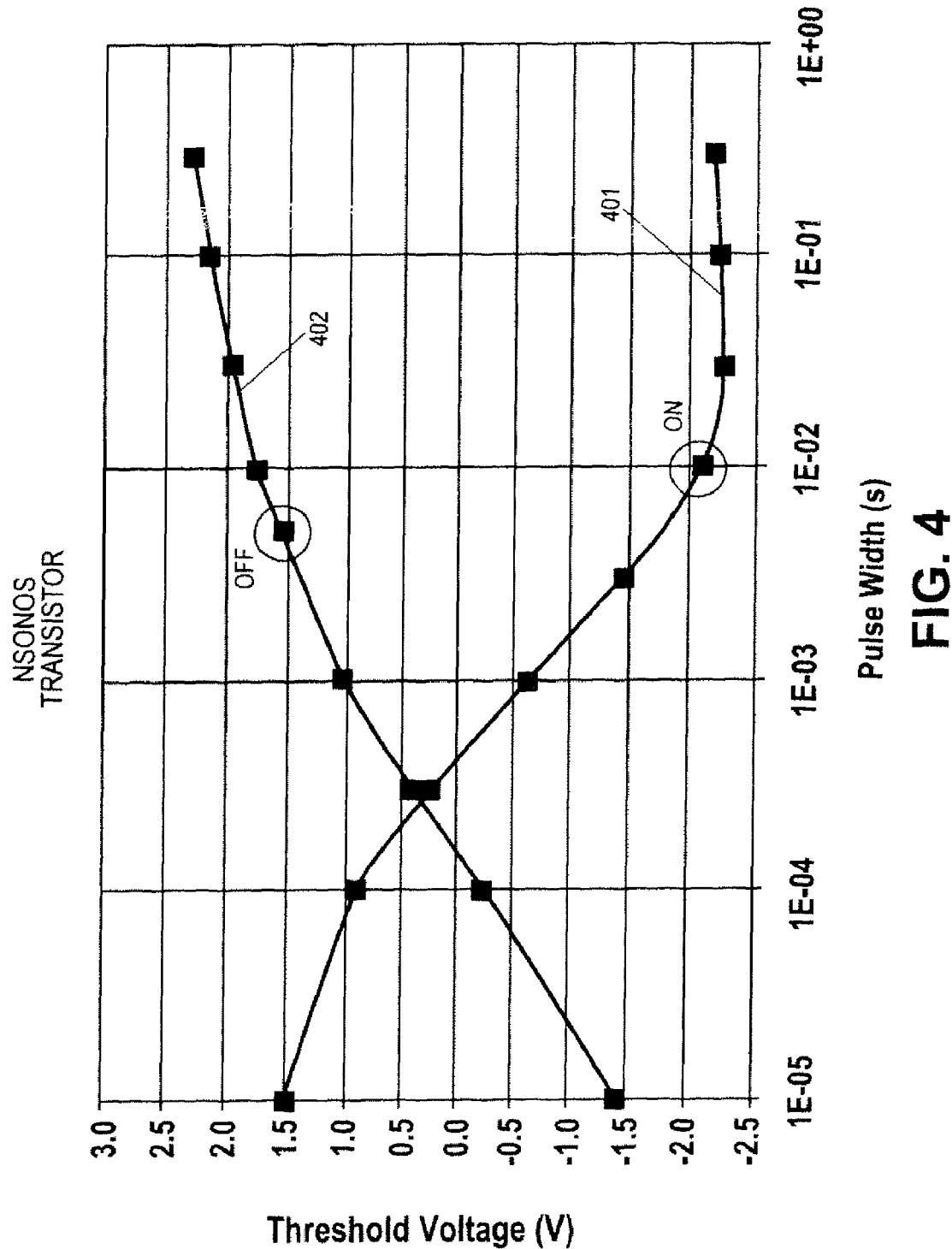

US 7,787,303 B2

PROGRAMMABLE CSONOS LOGIC ELEMENT

This application claims the benefit of the filing date of U.S. Provisional Patent Application No. 60/994,708, filed on Sep. 20, 2007, which is incorporated herein by reference in its entirety.

TECHNICAL FIELD

The present invention relates to nonvolatile semiconductor memory and, in particular, to the implementation of logic elements using complementary SONOS (CSONOS) memory cells.

BACKGROUND

SONOS is a type of non-volatile trapped-charge memory technology based on CMOS technology. A SONOS transistor is a type of insulated gate field effect transistor with an oxide-nitride-oxide stack (ONO stack) instead of a single oxide layer. SONOS transistors can be fabricated in large arrays where each transistor can store one bit of information. A single SONOS transistor can be switched between a normally off state (logical "0") and a normally on state (logical "1") by storing charge in a charge-trapping layer, where the polarity of the stored charge determines which state the transistor is in. Charge of one polarity raises the threshold voltage of the transistor and charge of the opposite polarity lowers the threshold voltage. The difference between the two threshold voltages, known as the sense window, is a measure of data integrity. The state of the SONOS transistor can be read by applying a voltage across the transistor and sensing the current that flows through the transistor. If the current is less than some specified maximum leakage current, the transistor is read as "off." If the current is greater than some specified minimum conduction current, the transistor is read as "on." However, reading the state of the transistor in this way disturbs the trapped-charge with each read, causing the sense window to shrink and reducing the integrity of the stored data.

BRIEF DESCRIPTION OF THE DRAWINGS

The present invention is illustrated by way of example and not limitation in the figures of the accompanying drawings, in which:

FIG. 1B illustrates programming a CSONOS transistor pair in one embodiment;

FIG. 1C illustrates a CSONOS transistor pair in a programmed state in one embodiment;

FIG. 1D illustrates erasing a CSONOS transistor pair in one embodiment;

FIG. 1E illustrates a CSONOS-transistor pair in an erased state in one embodiment;

FIG. 2A is a schematic representation of a CSONOS transistor pair in a programming configuration in one embodiment;

FIG. 2B is a schematic representation of a CSONOS transistor pair in a programmed state in one embodiment;

FIG. 2C is a schematic representation of a programmed CSONOS transistor pair in a read configuration in one embodiment;

FIG. 3A is a schematic representation of a CSONOS transistor pair in an erasing configuration in one embodiment;

FIG. 3B is a schematic representation of a CSONOS transistor pair in an erased state in one embodiment;

FIG. 3C is a schematic representation of an erased CSONOS transistor pair in a read configuration in one embodiment;

FIG. 4 illustrates state transitions for an NSONOS device in one embodiment;

DETAILED DESCRIPTION

Embodiments of a programmable complementary SONOS (CSONOS) logic element are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

Embodiments of the present invention are described herein using SONOS memory devices as examples of non-volatile trapped-charge memory devices for ease of description. However, embodiments of the invention are not so limited and may include any type of non-volatile, trapped-charge device.

Figure 1A:
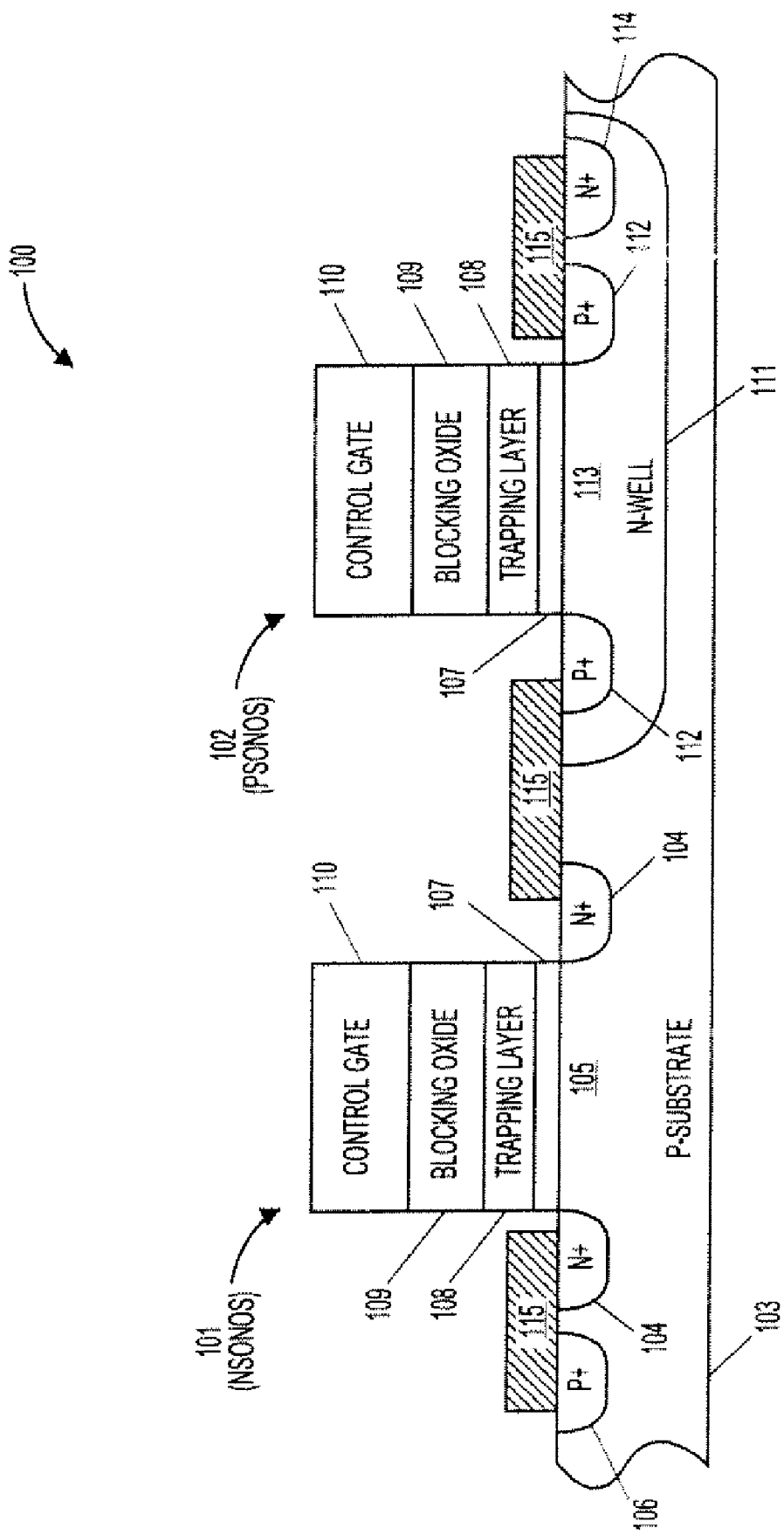
FIG. 1A illustrates the structure of a CSONOS transistor pair in one embodiment.

FIG. 1A illustrates a complementary SONOS (CSONOS) transistor pair 100 according to one embodiment of the present invention. In FIG. 1A, an NMOS SONOS transistor (NSONOS) 101 and a PMOS SONOS transistor (PSONOS) 102 are fabricated in a P-type substrate 103.

The NSONOS transistor 101 has two N+ source/drain diffusions 104 in the P-type substrate 103 that define a channel 105, and a P+ diffusion 106 that provides an ohmic contact (i.e., a non-rectifying contact) to the P-type substrate 103, which is the body of the NSONOS transistor 101. Above the channel 105 is a thin oxide layer (e.g., silicon dioxide) 107 known as the tunnel oxide layer. Above the tunnel oxide layer 107 is a nitride layer 108 (e.g., silicon nitride or silicon oxinitride) known as the trapping layer. Above the trapping layer 108 is another oxide layer 109 (e.g., silicon dioxide) known as the blocking oxide layer. Above the blocking oxide layer 109 is a control gate 110, which is typically polysilicon.

The PSONOS 102 transistor is fabricated in a diffused N-well 111 in the P-type substrate 103. The PSONOS transistor 102 has two P+ source/drain diffusions 112 that define a channel 113 and an N+ diffusion 114 that provides an ohmic contact to the N-well 111, which is the body of the PSONOS transistor 102. In other respects, the gate stack of the PSONOS transistor 102 is the same as the NSONOS transistor 101.

As illustrated in FIG. 1B, metallization 115 is used to connect the drain 104 of the NSONOS transistor 101 to the drain 112 of the PSONOS transistor 102, the source 104 of the NSONOS transistor 101 to the P+ ohmic contact 106 and the source 112 of the PSONOS transistor 101 to the N+ ohmic contact 114.

FIG. 1B illustrates how the CSONOS transistor pair 100 is programmed. In FIG. 1B, a positive voltage (e.g., +10 volts) is applied between the control gate 110 of the NSONOS transistor 101 and the P-type substrate 103 (via ohmic contact 106) and between the control gate 110 and the N-well 111 of the PSONOS transistor 102 (via ohmic contact 114). The resulting electric fields in the two transistors cause electrons 116 (shown as minus signs) to tunnel through the tunnel oxide layers 107 via Fowler-Nordheim tunneling and become trapped at trapping sites in the trapping layers 108.

FIG. 1C illustrates the state of the CSONOS transistor pair 100 after the programming voltages are removed. In the NSONOS transistor 101, the trapped electrons 116 repel electrons from the channel 105. The electron-depleted channel has a positive space charge (shown as plus signs) that forms P-N junctions with the N+ source and drain diffusions 104. In this state, the NSONOS transistor 101 is "off" because one of the P-N junctions will be reverse biased under any polarity of applied drain-source voltage. In the PSONOS transistor 102, the trapped electrons 116 attract holes to the channel 113, inverting the normally negative channel. The inverted channel provides a conductive path between the P+ source and drain diffusions 112. In this state, the PSONOS transistor is "on."

FIGS. 1D and 1E illustrate erasing operations and the erased state of the CSONOS transistor pair 100, respectively. In FIG. 1D, a negative voltage (e.g., −10 volts) is applied between the control gate 110 of the NSONOS transistor 101 and the P-type substrate 103 (via ohmic contact 106) and between the control gate 110 and the N-well 111 of the PSONOS transistor 102 (via ohmic contact 114). The resulting electric fields in the two devices cause holes 117 (shown as plus signs) to tunnel through the tunnel oxide layers 107 and become trapped at trapping sites in the trapping layers 108.

FIG. 1E illustrates the state of the CSONOS transistor pair 100 after the erase voltage is removed. In the NSONOS transistor 101, the trapped holes 117 attract electrons (shown as minus signs) to the channel 105, inverting the normally positive channel. The inverted channel provides a conductive path between the N+ source and drain diffusions 104. In this state, the NSONOS transistor 101 is "on." In the PSONOS transistor 102, the trapped holes 117 repel holes from the channel 113. The hole-depleted channel has a negative space charge that forms P-N junctions with the P+ source and drain diffusions 112. In this state, the PSONOS transistor is "off."

FIGS. 2A and 2B are schematic diagrams of the CSONOS transistor pair 100 in the programming configuration and the programmed state, respectively in one embodiment, corresponding to FIGS. 1B and 1C. FIG. 2C is a circuit 200 in one embodiment illustrating how the programmed CSONOS transistor pair 100 may be read without disturbing the trapped charge on the two transistors. A connection 202 may be made between the gate 110 and the source 112 of PSONOS transistor 102 and read voltage (e.g., +1.8 volts) may be applied to the gate 110 of PSONOS transistor 102. A connection 201 may be made between the gate 110 and the source 104 of NSONOS transistor 101 and the gate 110 of the NSONOS transistor may be grounded. In the programmed state, the PSONOS device is "on" and operates like a closed switch. Therefore, there is an effective short circuit between point A and point B. Conversely, the NSONOS device is "off" in the programmed state and operates like an open switch. Therefore, there is an effective open circuit between point C and point B. As a result, the read voltage appears at the common drain terminals 112/104 of the two transistors. If the common connection (metallization 115) is connected to a high impedance load (e.g., the gate of another MOSFET transistor, not shown), then the read voltage can be detected (e.g., by the load transistor being "on"). The read voltage may be associated with a logical data value, such as a logic "1" value. The trapped charge in the PSONOS transistor 102 is not disturbed because all of the terminals of the PSONOS transistor are at the same voltage and no current flows through transistor 102. The trapped charge in the NSONOS transistor 101 is not disturbed because the gate and source of the NSONOS transistor are at the same voltage and the read voltage on the drain of the NSONOS transistor is too small to have a disturbing effect.

FIGS. 3A and 3B are schematic diagrams of the CSONOS transistor pair in the erasing configuration and the erased state, respectively, corresponding to FIGS. 1D and 1E. FIG. 3C depicts circuit 200 in one embodiment illustrating how the erased CSONOS transistor pair 100 may be read without disturbing the trapped charge on the two transistors. As above, a connection 202 may be made between the gate 110 and the source 112 of PSONOS transistor 102 and a read voltage (e.g., +1.8 volts) may be applied to the gate 110 of PSONOS transistor 102. A connection 201 may be made between the gate 110 and the source 104 of NSONOS transistor 101 and the gate 110 of the NSONOS transistor may be grounded. In the erased state, the PSONOS device is "off" and operates like an open switch. Therefore, there is an effective open circuit between point A and point B. Conversely, the NSONOS device is "on" in the erased state and operates like a closed switch. Therefore, there is an effective short circuit between point C and point B. As a result, the ground voltage appears at the common drain terminals 112/104 of the two transistors. Again, if the common connection (metallization 115) is connected to a high impedance load (e.g., the gate of another MOSFET transistor, not shown), then the ground voltage can be detected (e.g., by the load transistor being "off"). The ground voltage may be associated with a logical data value, such as a logic "0" value. The trapped charge in the NSONOS transistor 101 is not disturbed because all of the terminals of the PSONOS transistor are at the same voltage and no current flows through transistor 101. The trapped charge in the PSONOS transistor 102 is not disturbed because the gate and source of the PSONOS transistor are at the same voltage and the ground voltage on the drain of the PSONOS transistor is too small to have a disturbing effect.

Figure 8:
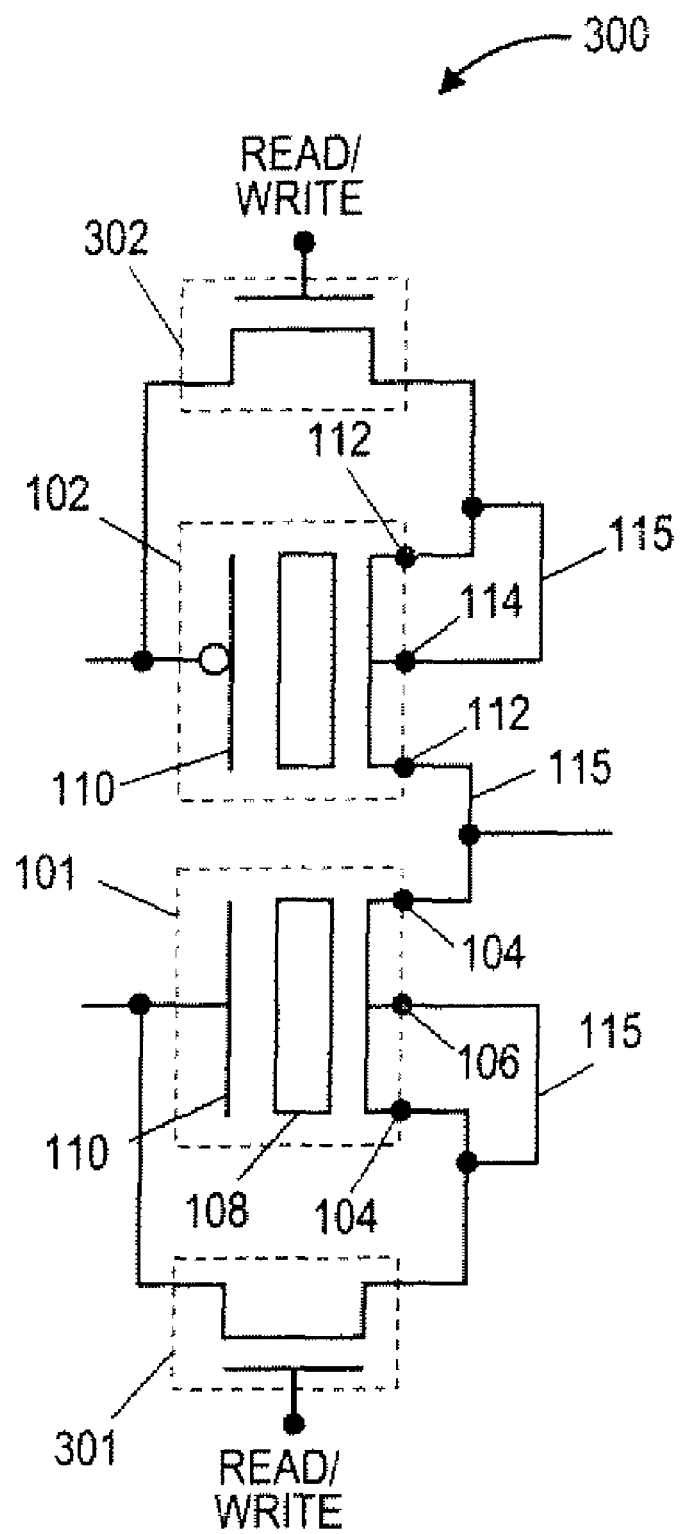
FIG. 8 illustrates a switchable READ/WRITE CSONOS circuit configuration in one embodiment.

FIG. 8 illustrates a circuit 300 in one embodiment in which the CSONOS pair 100 may be switched between a PROGRAM or ERASE configuration (i.e., a WRITE configuration), as per FIGS. 2A and 3A, and a READ configuration as per FIGS. 2C and 3C. In FIG. 8, connection 202 may be replaced by a switch, such as MOSFET transistor switch 302, and connection 201 may be replaced with a switch, such as MOSFET transistor switch 301. Switches 301 and 302 may be controlled by a READ/WRITE control signal, such that a WRITE signal causes switches 301 and 302 to be OPEN and a READ signal causes switches 301 and 302, FIG. 4 illustrates the ON to OFF (curve 401) and OFF to ON (curve 402) threshold voltage transitions for an exemplary NSONOS transistor, which may occur for program and erase pulse durations of approximately 5 ms and 10 ms, respectively, for respective programming and erase voltages of approximately +10 volts and −10 volts, for example. The difference between these threshold voltages define the sense window at the beginning of life (BOL) of the device. For the exemplary NSONOS device illustrated, the separation between the BOL ON and OFF threshold voltages is approximately 3.5 volts.

Figure 5:
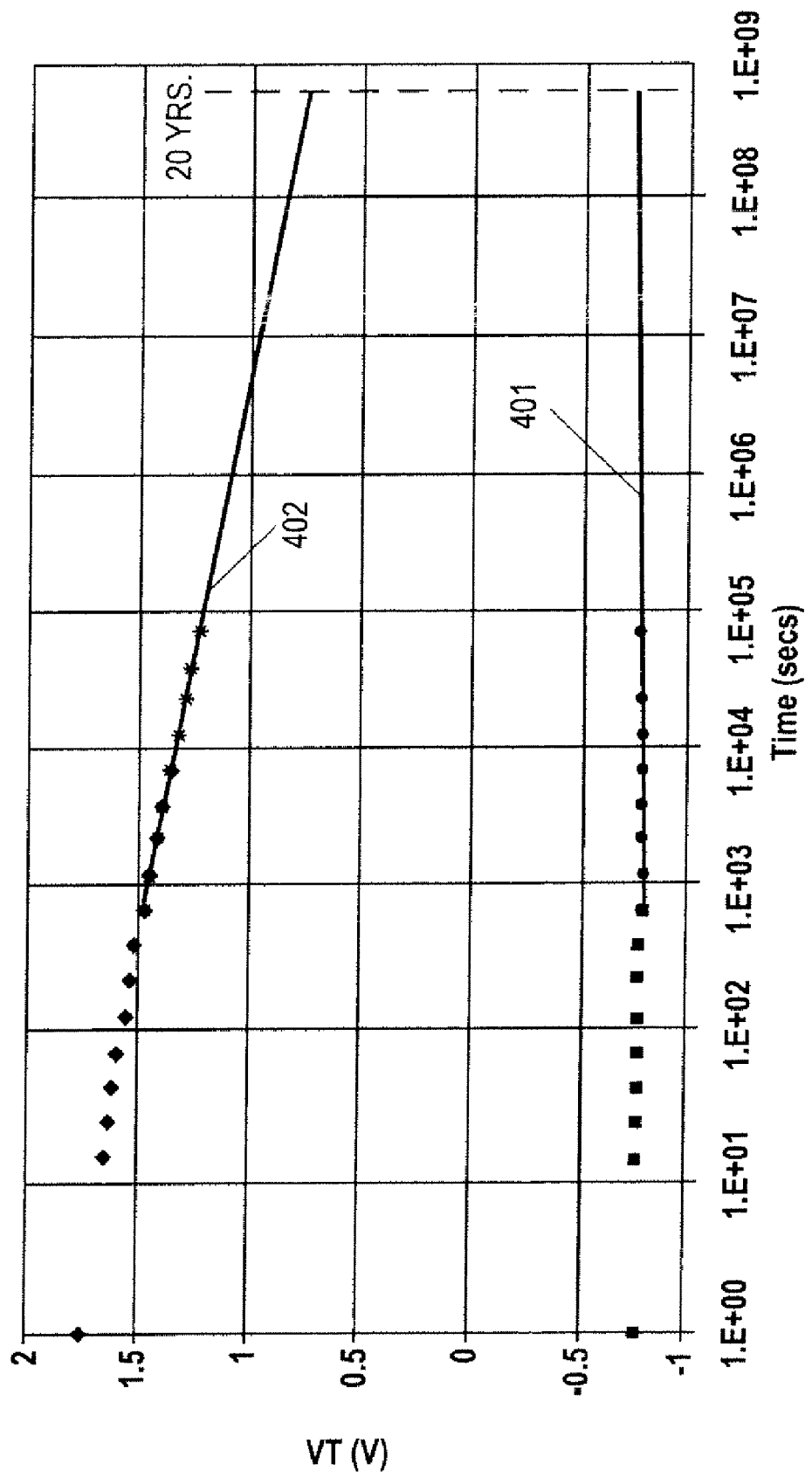
FIG. 5 illustrates data retention of an NSONOS device after endurance cycling in one embodiment.

FIG. 5 illustrates an extrapolation of the data retention curves of the NSONOS transistor of FIG. 4 after 100,000 read cycles. In FIG. 5, the extrapolated EOL sense window of the NSONOS transistor is approximately 1.5 volts after approximately 20 years ($6.31 \times 10^8$ seconds).

Figure 6:
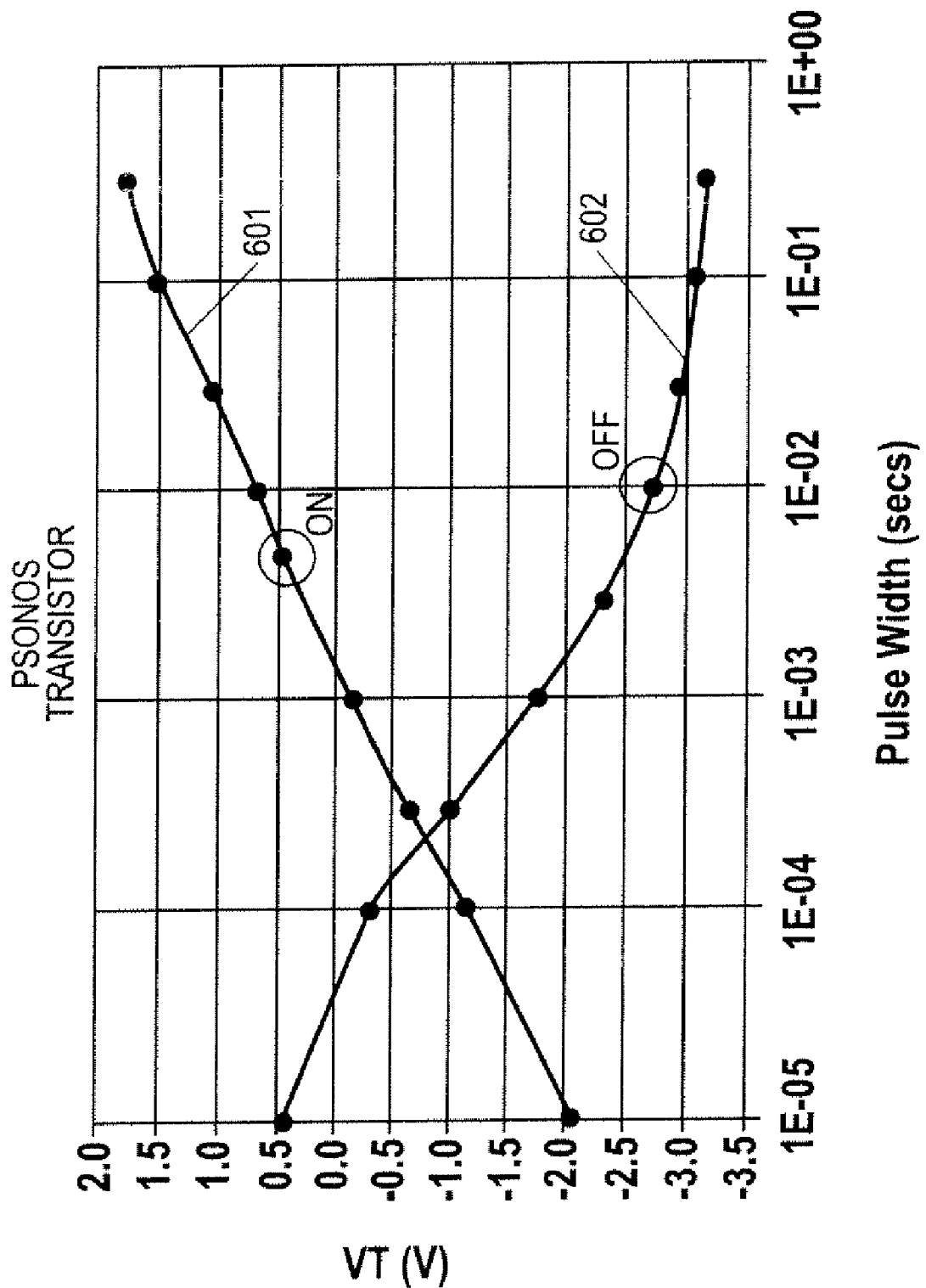
FIG. 6 illustrates state transitions for a PSONOS device in one embodiment.

FIG. 6 illustrates the ON to OFF (CURVE 601) and OFF to ON (CURVE 602) threshold voltage transitions for an exemplary PSONOS transistor, which occurs at pulse durations of 10 ms and 5 ms, respectively, for respective programming and erase operations at +10 volts and −10 volts. The sense window at the beginning of life of the device is approximately 3.25 volts.

Figure 7:
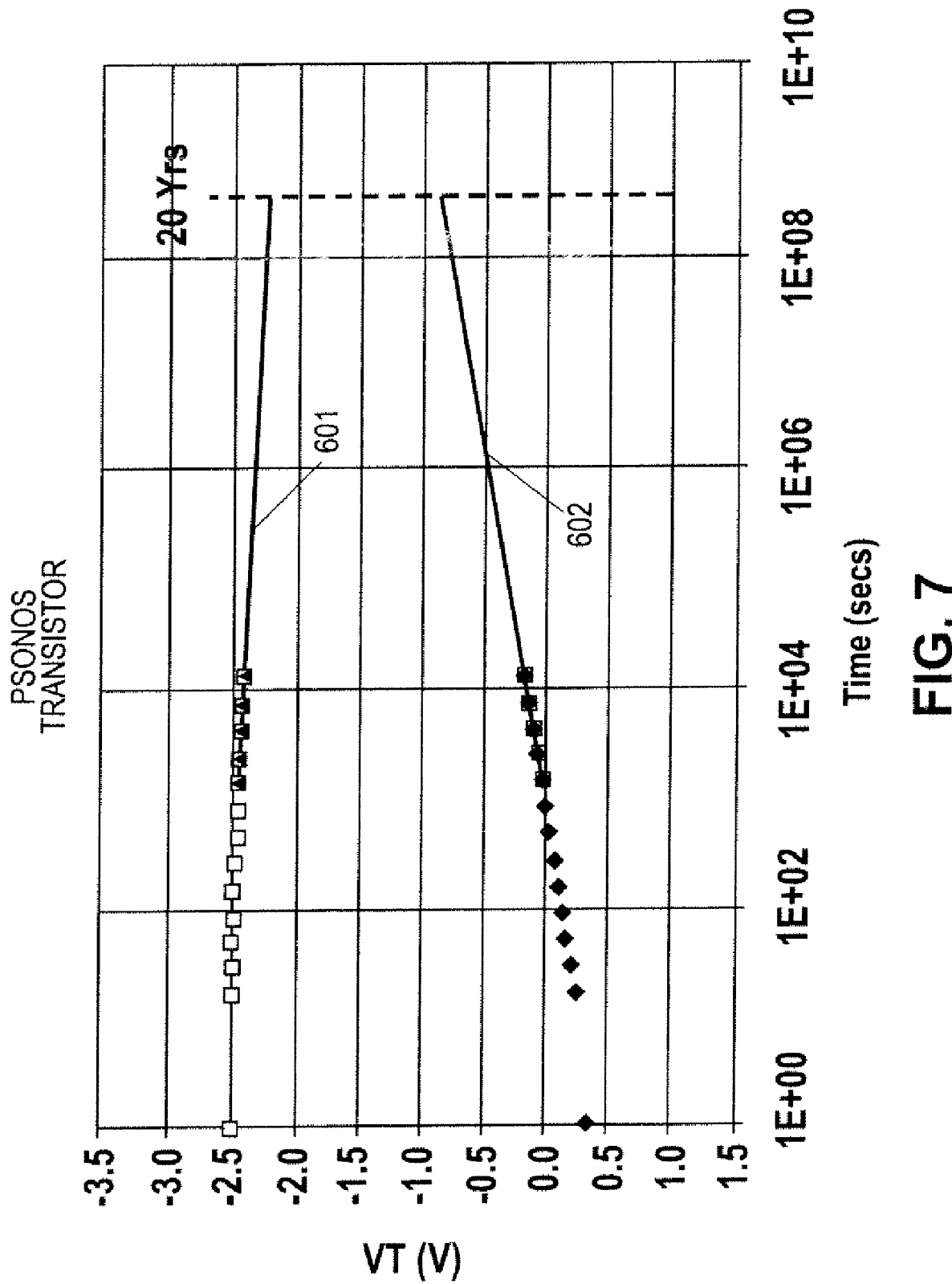
FIG. 7 illustrates data retention of a PSONOS device after endurance cycling in one embodiment.

FIG. 7 illustrates an extrapolation of data retention curves of the PSONOS transistor of FIG. 6 after 100,000 read endurance cycles. In FIG. 7, the extrapolated EOL sense window of the PSONOS transistor is approximately 1.35 volts after 20 years.

Figure 9:
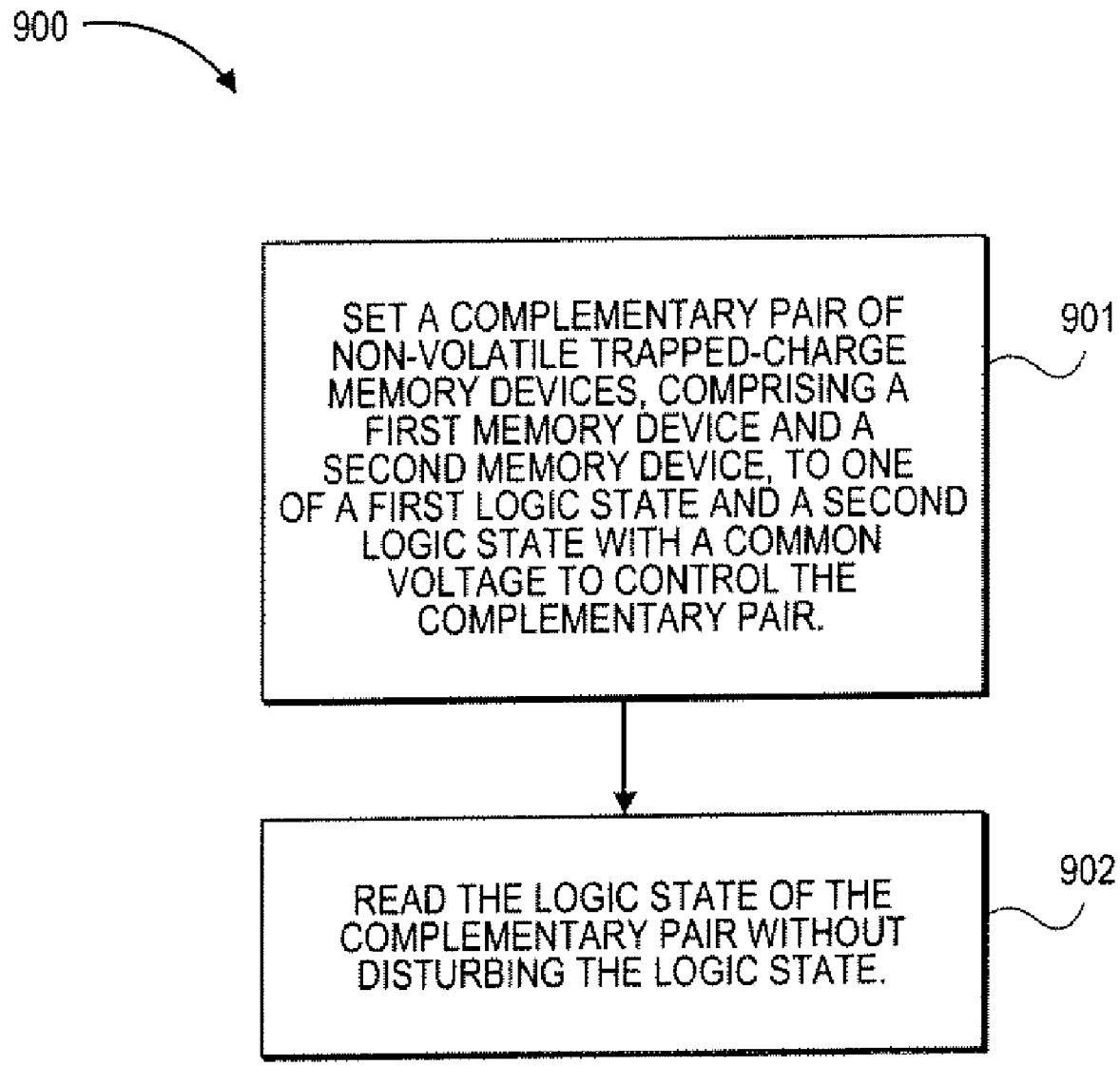
FIG. 9 is a flowchart illustrating a method according to one embodiment of the invention.

FIG. 9 is a flowchart illustrating a method for a programmable CSONOS logic element, which includes: setting a complementary pair of non-volatile trapped-charge memory devices, including a first memory device and a second memory device, to one of a first logic state and a second logic state with a common voltage to control the complementary pair (operation 901); and reading the logic state of the complementary pair without disturbing the logic state (operation 902).

The foregoing discussion has been limited to SONOS transistors for clarity and ease of description. By convention, SONOS stands for "Silicon-Oxide-Nitride-Oxide-Silicon," where the first "Silicon" refers to the channel region material, the first "Oxide" refers to the tunnel dielectric layer, "Nitride" refers to the charge-trapping dielectric layer, the second "Oxide" refers to the blocking oxide layer and the second "Silicon" refers to the gate layer. However, embodiments of the present invention include the use of "SONOS-type" devices, which are not limited to these specific materials.

With reference to FIG. 1A, the substrate 103 and, hence, the channel regions may be any material suitable for semiconductor device fabrication. In one embodiment, the substrate may be a bulk substrate of a single crystal of a material which may include, but is not limited to, silicon, germanium, silicon/germanium or a III-V compound semiconductor material. In another embodiment, the substrate may be a bulk layer with a top epitaxial layer. In a specific embodiment, the bulk layer may be a single crystal of a material which may include, but is not limited to, silicon, germanium, silicon/germanium, a III-V compound semiconductor material and quartz, while the top epitaxial layer may be a single crystal layer which may include, but is not limited to, silicon, germanium, silicon/germanium and a III-V compound semiconductor material. In another embodiment, the substrate may be a top epitaxial layer on a middle insulator layer which is above a lower bulk layer. The top epitaxial layer may be a single crystal layer which may include, but is not limited to, silicon (e.g., to form a silicon-on-insulator (SOI) semiconductor substrate), germanium, silicon/germanium and a III-V compound semiconductor material. The insulator layer may include, but is not limited to, silicon dioxide, silicon nitride and silicon oxy-nitride. The lower bulk layer may be a single crystal which may include, but is not limited to, silicon, germanium, silicon/germanium, a III-V compound semiconductor material and quartz. The substrate and, hence, the channel region, may include dopant impurity atoms. In a specific embodiment, the channel region is doped P-type and, in an alternative embodiment, channel region is doped N-type.

Source/drain regions (104, 112) in the substrate may be any regions having opposite conductivity to the channel region. For example, in accordance with an embodiment of the present invention, the source/drain regions are N-type doped regions while the channel region is a P-type doped region. In one embodiment, the substrate and, hence, the channel region, may be boron-doped single-crystal silicon having a boron concentration in the range of $10^{15}$-$10^{19}$ atoms/cm$^3$. The source/drain regions may be phosphorous-doped or arsenic-doped regions having a concentration of N-type dopants in the range of $5 \times 10^{16}$-$5 \times 10^{19}$ atoms/cm$^3$. In a specific embodiment, the source/drain regions may have a depth in the substrate in the range of 80-200 nanometers. In accordance with an alternative embodiment of the present invention, the source/drain regions are P-type doped regions while the channel region is an N-type doped region.

The tunnel dielectric layer 107 may be any material and have any thickness suitable to allow charge carriers to tunnel into the charge-trapping layer under an applied gate bias while maintaining a suitable barrier to leakage when the device is unbiased. In one embodiment, the tunnel dielectric layer may be a silicon dioxide or silicon oxy-nitride layer formed by a thermal oxidation process. In another embodiment, the tunnel dielectric layer may be a high dielectric constant (high-k) material formed by chemical vapor deposition or atomic layer deposition and may include, but is not limited to, hafnium oxide, zirconium oxide, hafnium silicate, hafnium oxy-nitride, hafnium zirconium oxide and lanthanum oxide. In a specific embodiment, the tunnel dielectric layer may have a thickness in the range of 1-10 nanometers. In a particular embodiment, the tunnel dielectric layer may have a thickness of approximately 2 nanometers.

The charge-trapping layer 108 may be any material and have any thickness suitable to store charge and, hence, raise the threshold voltage of gate stack. In one embodiment, the charge-trapping layer may be a dielectric material formed by a chemical vapor deposition process and may include, but is not limited to, stoichiometric silicon nitride, silicon-rich silicon nitride and silicon oxy-nitride. In one embodiment, the thickness of the charge-trapping layer may be in the range of 5-10 nanometers.

The top dielectric (blocking oxide) 109 layer may be any material and have any thickness suitable to maintain a barrier to charge leakage without significantly decreasing the capacitance of the gate stack. In one embodiment, the top dielectric layer is formed by a chemical vapor deposition process and is comprised of silicon dioxide or silicon oxy-nitride. In another embodiment, the top dielectric layer may be a high-k dielectric material formed by atomic layer deposition and may include, but is not limited to, hafnium oxide, zirconium oxide, hafnium silicate, hafnium oxy-nitride, hafnium zirconium oxide and lanthanum oxide. In a specific embodiment, the top dielectric layer may have a thickness in the range of 1-20 nanometers.

The control gate layer 110 may be any conductor or semiconductor material suitable for accommodating a bias voltage during operation of the SONOS-type device. In accordance with an embodiment of the present invention, the gate layer may be doped poly-crystalline silicon formed by a chemical vapor deposition process. In another embodiment, the gate layer may be a metal-containing material formed by physical vapor deposition and may include, but is not limited to, metal nitrides, metal carbides, metal silicides, hafnium, zirconium, titanium, tantalum, aluminum, ruthenium, palladium, platinum, cobalt and nickel.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
setting a complementary pair of non-volatile trapped-charge memory devices, comprising a P-type SONOS-type memory device having first gate, drain and source terminals and a N-type SONOS-type memory device having second gate, drain and source terminals, to one of a first logic state and a second logic state with a common voltage to control the complementary pair, the complementary pair being set to the first logic state by programming the P-type SONOS-type device with the common voltage and erasing the N-type SONOS-type device with the common voltage and the complementary pair being set to the second logic state by erasing the P-type SONOS-type device with the common voltage and programming the N-type SONOS-type device with the common voltage;
coupling the first source terminal to a first logic level voltage and the second source terminal to a second logic level voltage; and
reading the logic state of the complementary pair without disturbing the logic state by:
connecting the first source terminal to the first gate terminal;
connecting the second source terminal to the second gate terminal; and
sensing the logic level at a common connection between the first drain terminal and the second drain terminal.

2. The method of claim 1, wherein the logic state of the complementary pair comprises the first logic state, wherein the P-type SONOS-type device is protected from source and drain disturbs, and wherein the N-type SONOS-type device is protected from source disturbs.

3. The method of claim 1, wherein the logic state of the complementary pair comprises the second logic state, wherein the N-type SONOS-type device is protected from source and drain disturbs, and wherein the P-type SONOS-type device is protected from source disturbs.

4. The method of claim 1, wherein the common voltage is connected to the first gate and the second gate, and wherein setting the complementary pair to the first logic state comprises setting the common voltage to approximately +10 volts.

5. The method of claim 1, wherein the common voltage is connected to the first gate and the second gate, and wherein setting the complementary pair to the second logic state comprises setting the common voltage to approximately −10 volts.

6. The method of claim 1, wherein the first logic level voltage is approximately +1.8 volts, and wherein the second logic level voltage is approximately 0 volts.

7. The method of claim 1, wherein the first memory device and the second memory device each comprise a SONOS device.

8. A programmable device, comprising:
a first memory device comprising a non-volatile trapped-charge P-type SONOS-type memory device having first gate, drain and source terminals;
a second memory device comprising a non-volatile trapped-charge N-type SONOS-type memory device coupled to the first memory device, the second memory device having second gate, drain and source terminals, the first and second memory devices comprising a complementary pair;
the first drain terminal is connected to the second drain terminal;
the first source terminal and the first gate terminal are connected to a first logic level voltage;
the second source terminal and the second gate terminal are connected to a second logic level voltage; and
a common voltage is connected to the first gate and the second gate;
a switching matrix configured to apply the common voltage to the complementary pair and to control connections of the first logic level voltage and the second logic level voltage to the complementary pair, wherein
the programmable device is configured to be set to a first logic state when the first memory device is programmed and the second memory device is erased, the programmable device is configured to be set to a second logic state when the first memory device is erased and the second memory device is programmed and the logic state of the programmable device is presented at the connection between the first drain terminal and the second drain terminal.

9. The programmable device of claim 8, wherein the logic state comprises the first logic state, wherein the first logic level voltage and the second logic level voltage are configured to protect the P-type SONOS-type device from source and drain disturbs and to protect the N-type SONOS-type device from source disturbs.

10. The programmable device of claim 8, wherein the logic state comprises the second logic state, wherein the first logic level voltage and the second logic level voltage are configured to protect the N-type SONOS-type device from source and drain disturbs and to protect the P-type SONOS-type device from source disturbs.

11. The programmable device of claim 8, wherein to set the programmable device to the first logic state, the common voltage is approximately +10 volts.

12. The programmable device of claim 8, wherein to set the programmable device to the second logic state, the common voltage is approximately −10 volts.

13. The programmable device of claim 8, wherein the first logic level voltage is approximately +1.8 volts, and wherein the second logic level voltage is approximately 0 volts.

14. The programmable device of claim 8, wherein the first memory device and the second memory device each comprise a SONOS device.

* * * * *